(12) United States Patent
Chang et al.

(10) Patent No.: US 8,592,137 B2
(45) Date of Patent: Nov. 26, 2013

(54) METHODS FOR SMALL TRENCH PATTERNING USING CHEMICAL AMPLIFIED PHOTORESIST COMPOSITIONS

(75) Inventors: Ya Hui Chang, Hsinchu (TW); Chia-Chu Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 13/328,278

(22) Filed: Dec. 16, 2011

(65) Prior Publication Data

US 2013/0155381 A1 Jun. 20, 2013

(51) Int. Cl.
*G03F 7/20* (2006.01)
(52) U.S. Cl.
USPC .......................................... 430/394; 430/322
(58) Field of Classification Search
USPC ................................................. 430/322, 394
See application file for complete search history.

(56) References Cited

U.S. PATENT DOCUMENTS

2001/0003034 A1* 6/2001 Furukawa et al. ............ 430/313
2002/0160318 A1* 10/2002 Richter et al. ................ 430/324

* cited by examiner

*Primary Examiner* — Kathleen Duda
(74) *Attorney, Agent, or Firm* — Haynes and Boone, LLP

(57) ABSTRACT

A method for forming a pattern on a substrate is described. The method includes providing a substrate, forming a photosensitive layer over the substrate, exposing the photosensitive layer to a first exposure energy through a first mask, exposing the photosensitive layer to a second exposure energy through a second mask, baking the photosensitive layer, and developing the exposed photosensitive layer. The photosensitive layer includes a polymer that turns soluble to a developer solution, at least one photo-acid generator (PAG), and at least one photo-base generator (PBG). A portion of the layer exposed to the second exposure energy overlaps with a portion exposed to the first exposure energy.

20 Claims, 9 Drawing Sheets

METHODS FOR SMALL TRENCH PATTERNING USING CHEMICAL AMPLIFIED PHOTORESIST COMPOSITIONS

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, conventional photoresist or photosensitive layers comprise a base, which is not photosensitive. Thus, after an exposure process, exposed areas of a photoresist layer may exhibit less than desirable acid distribution contrast and base distribution contrast. This leads to lower pattern contrast, resulting in poor pattern profiles and/or poor resolution, particularly as pattern features continue to decrease in size.

Old methods for forming small trench critical dimensions (CDs) and small trench end-to-end spaces usually require a high cost exposure tool, such as EUV. Pattern shrinkage, which often trades off trench CDs for end-to-end CDs, also remains a problem.

Accordingly, what is needed is a method and photoresist material for manufacturing an integrated circuit device that addresses the above stated issues.

SUMMARY

The present disclosure relates to a method for forming a pattern on a substrate. The method includes providing a substrate, forming a photosensitive layer over the substrate, exposing the photosensitive layer to a first exposure energy through a first mask, exposing the photosensitive layer to a second exposure energy through a second mask, baking the photosensitive layer, and developing the exposed photosensitive layer. The photosensitive layer includes a polymer that turns soluble to a developer solution, at least one photo-acid generator (PAG), and at least one photo-base generator (PBG). A portion of the layer exposed to the second exposure energy overlaps with a portion exposed to the first exposure energy.

In another embodiment, the method for forming a pattern on a substrate that includes providing a substrate forming a photosensitive layer on a substrate, exposing the photosensitive layer to the first exposure energy through a first mask, exposing the photosensitive layer to the second exposure energy through a second mask, baking the photosensitive layer, and developing the exposed photosensitive layer. The photosensitive layer includes a polymer that turns soluble to a developer solution, a PAG at a first concentration that decomposes to form acid in response to a first exposure energy, and a PBG at a second concentration that decomposes to form a base in response to a second exposure energy. A portion of the layer exposed to the second exposure energy overlaps with a portion exposed to the first exposure energy.

In yet another embodiment, the method for forming a pattern on a substrate includes providing a substrate, forming a photosensitive layer on a substrate, wherein the photosensitive layer comprising a polymer that turns soluble to a developer solution, PAG at a first concentration that decomposes to form acid in response to a first exposure energy, and PBG at a second concentration that decomposes to form a base in response to a second exposure energy, adjusting the first concentration, second concentration, or both to improve contrast and/or a critical dimension in the pattern, adjusting an intensity of the first exposure energy, second exposure energy, or both to improve contrast and/or a critical dimension in the pattern, exposing the photosensitive layer to the first exposure energy through a first mask, exposing the photosensitive layer to the second exposure energy through a second mask, baking the photosensitive layer, and developing the exposed photosensitive layer. A portion of the layer exposed to the second exposure energy overlaps with the a portion exposed to the first exposure energy.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
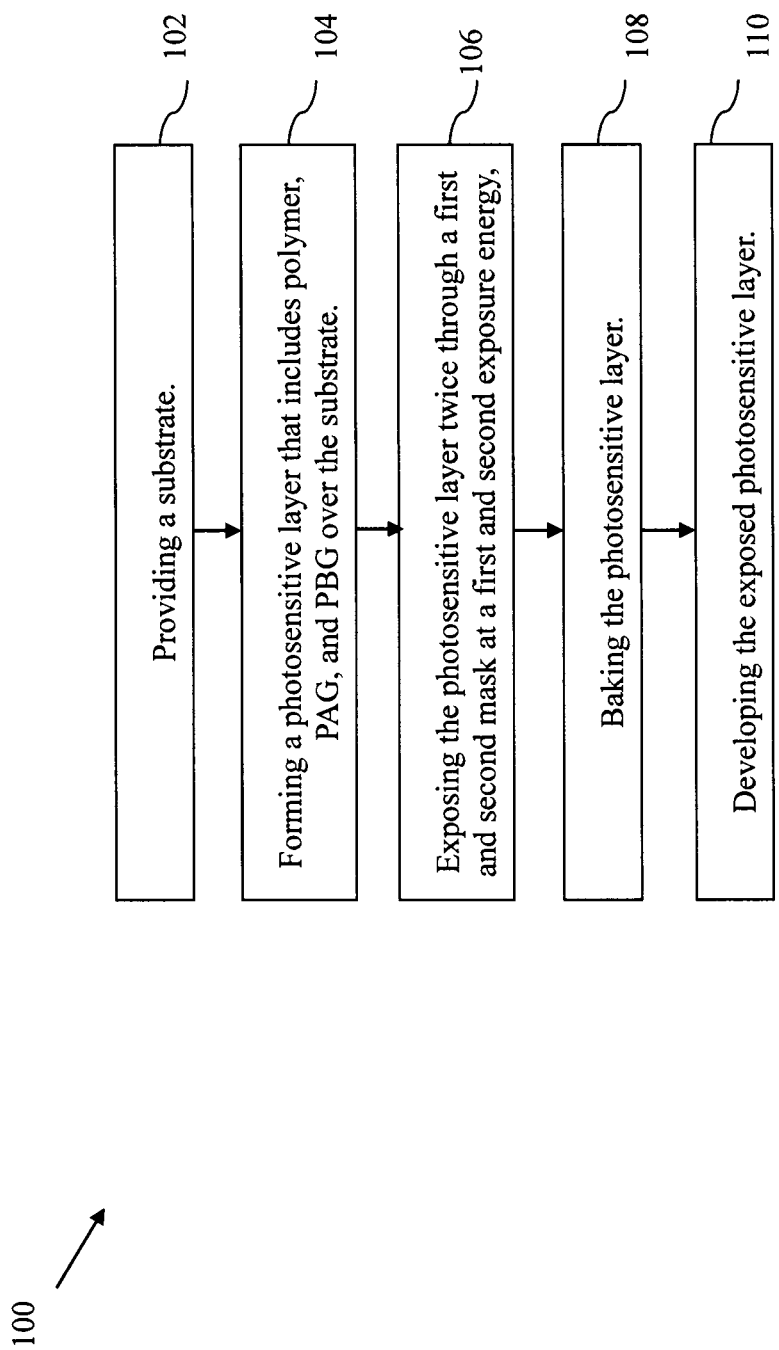
FIG. 1 is a flowchart of a method for forming a pattern on a substrate constructed according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Referring to FIG. 1, the method 100 begins at block 102 by providing a substrate 210. The semiconductor device 200 and the method of making the same are collectively described. The semiconductor device 200 may be a semiconductor wafer or other suitable device. In the present embodiment, the semiconductor device 200 includes a silicon substrate 210 having various doped regions, dielectric features, and/or multilevel interconnects. The substrate 210 may alternatively include other suitable semiconductor material, including Ge, SiGe, or GaAs. The substrate may alternatively include a non-semiconductor material such as a glass plate for thin-film-transistor liquid crystal display (TFT-LCD) devices. The semiconductor device 200 may further include one or more material layers to be patterned. Additionally, disposed on the semiconductor substrate 210 are other suitable material layers including organic bottom anti reflecting coating (BARC), inorganic BARC, etch resistance organic layer, and/or adhesion enhancement organic layer.

The substrate 210 includes various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS device) and regions configured for a P-type metal-oxide-semiconductor transistor device (referred to as a PMOS device). It is understood that the semiconductor device 200 may be formed by CMOS technology processing, and thus some processes are not described in detail herein.

Figure 2:
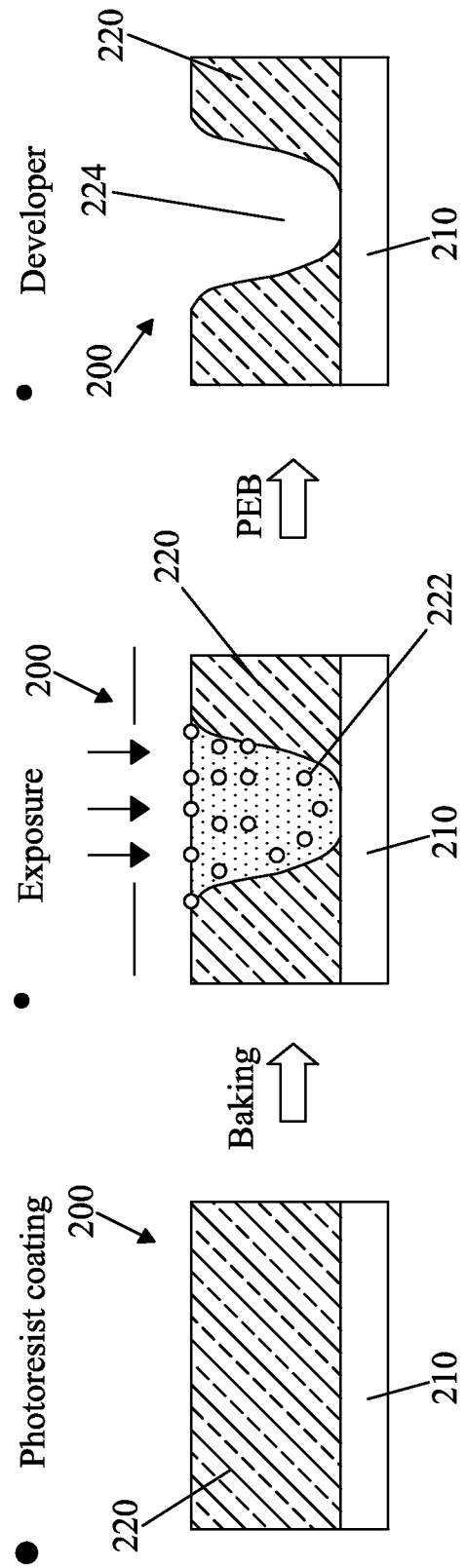
FIG. 2. illustrate sectional views of semiconductor device having a photosensitive layer at various stages of a lithography process constructed according to aspects of the present disclosure in an embodiment.

The method 100 proceeds to step 104, where a photosensitive layer containing a polymer, PAG, and PBG is formed. FIG. 2 provides sectional views of a semiconductor device 200 at various lithography patterning steps. Referring to FIG. 2, a photosensitive material layer (or photosensitive layer, photoresist layer or resist layer) 220 is disposed on the substrate 210. For example, a spin-coating technique is utilized to form the photosensitive layer 220 on the substrate 210. The photoresist layer is a positive-type or negative-type resist material and may have a multi-layer structure. The photosensitive layer 220 utilizes a chemical amplification (CA) resist material. In one embodiment, a positive CA resist material includes a polymer material that turns soluble to a developer such as a base solution after the polymer is reacted with acid. Alternatively, the CA resist material can be negative and include a polymer material that turns insoluble to a developer such as a base solution after the polymer is reacted with acid. The photosensitive layer 220 further includes a solvent filling inside the polymer. The solvent may be partially evaporated by a soft baking process. The photosensitive layer 220 also includes photo-acid generator (PAG) distributed in the photosensitive layer 220. When absorbing photo energy, the PAG decomposes and forms a small amount of acid 222. The PAG may have any suitable concentration, as is known in the art. After post exposure baking (PEB) and developing by a basic solution, an opening or trench 224 is revealed. Typically, the contrast at the edges of the trench 224 is blurred and results in errors in the CDs of the trench because the exposure energy decreases near the edges.

Examples of the PAG, that is, a compound capable of generating an acid upon exposure to high energy exposure are given below. It should be understood that they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl) sulfonium, (3-tert-butoxyphenyl) diphenylsulfonium, bis(3-tert-butoxyphenyl)phenylsulfonium, tris(3-tert-butoxypheny-1)sulfonium, (3,4-di-tert-butoxyphenyl) diphenylsulfonium, bis(3,4-di-tert-butoxyphenyl) phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, diphenylmethylsulfonium, methyl-2-oxopropylphenylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Iodinium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazo-methane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyl-diazomethane, methylsulfonylbenzoyldiazomethane, and tert-butoxycarbonyl-4-methylphenylsulfonyldiazomethane.

N-sulfonyloxyimide PAGs include combinations of imide skeletons with sulfonates. Exemplary imide skeletons are succinimide, naphthalene dicarboxylic acid imide, phthalimide, cyclohexylcarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate PAGs include benzoin tosylate, benzoin mesylate, and benzoin butanesulfonate.

Pyrogallol trisulfonate PAGs include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate PAGs include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

PAGs in the form of glyoxime derivatives include bis-o-(p-toluenesulfonyl)-.alpha.-dimethylglyoxime, bis-o-(p-toluenesulfonyl)-.alpha.-diphenylglyoxime, bis-o-(p-toluenesulfonyl)-.alpha.-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-.alpha.-dimethylglyoxime, bis-o-(n-butanesulfonyl)-.alpha.-diphenylglyoxime, bis-o-(n-butanesulfonyl)-.alpha.-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-.alpha.-dimethylglyoxime, bis-o-(trifluoromethane-sulfonyl)-.alpha.-dimethylglyoxime, bis-o-(1,1,1-trifluoroethanesulfonyl)--.alpha.-dimethylglyoxime, bis-o-(tert-butanesulfonyl)-.alpha.-dimethylglyoxime, bis-o-(perfluorooctanesulfonyl)-.alpha.-dimethylglyoxime, bis-o-(cyclohexylsulfonyl)-.alpha.-dimethylglyoxime, bis-o-(benzenesulfonyl)-.alpha.-dimethylglyoxime, bis-o-(p-fluorobenzenesulfonyl)-.alpha.-dimethylglyoxime, bis-o-(p-tert-butylbenzenesulfonyl)-.alpha.-dimethylglyoxime, bis-o-(xylenesulfonyl)-.alpha.-dimethylglyoxime, and bis-o-(camphorsulfonyl)-.alpha.-dimethylglyoxime.

The photosensitive layer 220 also includes a photo-base generator (PBG) (not shown) distributed in the polymer. When absorbing photo energy, the PBG decomposes and forms a small amount of base. The PBG may have any suitable concentration, as is known in the art. The PBG is capable of neutralizing acid, and specifically the acid formed by the activation of the PAG. The PBG tightens resolution to provide improved patterns, increased contrast, and smaller CDs for the trench 224. The resolution of resulting patterns is improved by, for example, tuning or adjusting the loading or concentration of the PBGs with respect to the PAGs. For example, the ratios of the PAG to the PBG may be optimized such that the concentration of PBG in the photosensitive layer 220 is greater than the concentration of the PAG, e.g., the ratio of PAG to PBG may be 1:1.2, 1:1.4, 1:1.6, 1:2, etc. Alternatively, the PAG and PBG may be present in similar amounts.

Examples of the PBG include at least one of a carbamate, a carbamonylhydroxyamine, oxime, sulfonamide, lactam (or cyclic amide), other suitable materials, and/or combinations thereof. An exemplary carbamate is represented by the formula:

Formula 1(a)

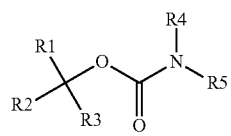

R1, R2, R3, R4, and/or R5 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl (thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary carbamonylhydroxyamine is represented by the formula:

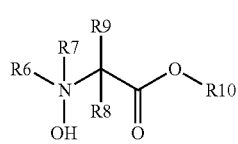

Formula 1(b)

R6, R7, R8, R9, and/or R10 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl (thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary oxime is represented by the formula:

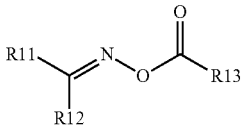

Formula 1(c)

R11, R12, and/or R13 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl (thiol) (—SH), a lactone, an amide, a carboxylic acid, and/or ester functional group. It is understood that the straight or cyclic alkyl, alkoxyl, fluoroalkyl, and/or fluoroalkoxyl chain may comprise other suitable functional groups.

An exemplary sulfonamide is represented by the formula:

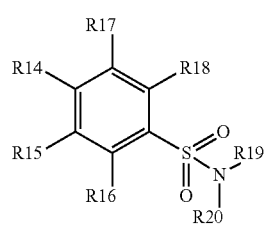

Formula 1(d)

R14, R15, R16, R17, R18, R19, and/or R20 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, and/or fluoroalkoxyl chain can comprise a hydroxide (—OH), an amine, a sulfhydryl (thiol) (—SH), a lactone, an amide, a carboxylic acid, and/or ester functional group. It is understood that the straight or cyclic alkyl, alkoxyl, fluoroalkyl, or fluoroalkoxyl chain may comprise other suitable functional groups.

An exemplary lactam is represented by the formulas:

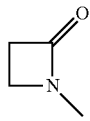

Formula 1(e)

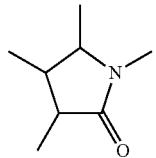

Formula 1(f)

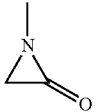

Formula 1(g)

Alternatively, the exemplary lactam is represented by the formula

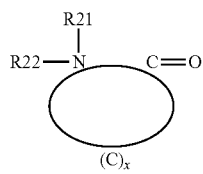

Formula 1(h)

R21 and/or R22 comprise a hydrogen, a hydroxide (OH), a halide, an aromatic carbon ring, a straight or cyclic alkyl chain, a straight or cyclic alkoxyl chain, a straight or cyclic fluoroalkyl chain, a straight or cyclic fluoroalkoxyl chain, other suitable material, and/or combinations thereof. A chain contains from about 1 to about 8 carbon atoms. The straight or cyclic alkyl, alkoxyl, fluoroalkyl, or fluoroalkoxyl chain can comprise a hydroxide (—OH), an amine, a sulfhydryl (thiol) (—SH), a lactone, an amide, a carboxylic acid, and/or ester functional group. It is understood that the straight or cyclic alkyl, alkoxyl, fluoroalkyl, or fluoroalkoxyl chain may comprise other suitable functional groups. X is from about 2 to about 5.

The semiconductor device 200 is then moved to a lithography apparatus for an exposing process. In the exposing process step 106, the photosensitive layer 220 is exposed twice to an exposure energy such as deep ultra-violet (DUV) through a photomask (mask or reticle) having a predefined pattern, resulting in a resist pattern that includes a plurality of exposed regions such as exposed features and a plurality of unexposed regions. In one embodiment, the exposure beam used to expose the photosensitive layer 220 includes extreme ultraviolet (EUV) exposure and/or electron-beam (e-beam) writing. Alternatively, the exposure process may utilize other exposure beams, such as ion beam, x-ray, deep ultraviolet, and other proper exposure energy.

The patterned exposed and unexposed portions are formed by illuminating material layer with a exposure source through one or more photomasks (or reticles) to form an image pattern. The process may implement krypton fluoride (KrF) excimer lasers, argon fluoride (ArF) excimer lasers, ArF immersion lithography, ultraviolet (UV) exposure, extreme ultra-violet (EUV) exposure, and/or electron-beam (e-beam) writing.

Figure 3:
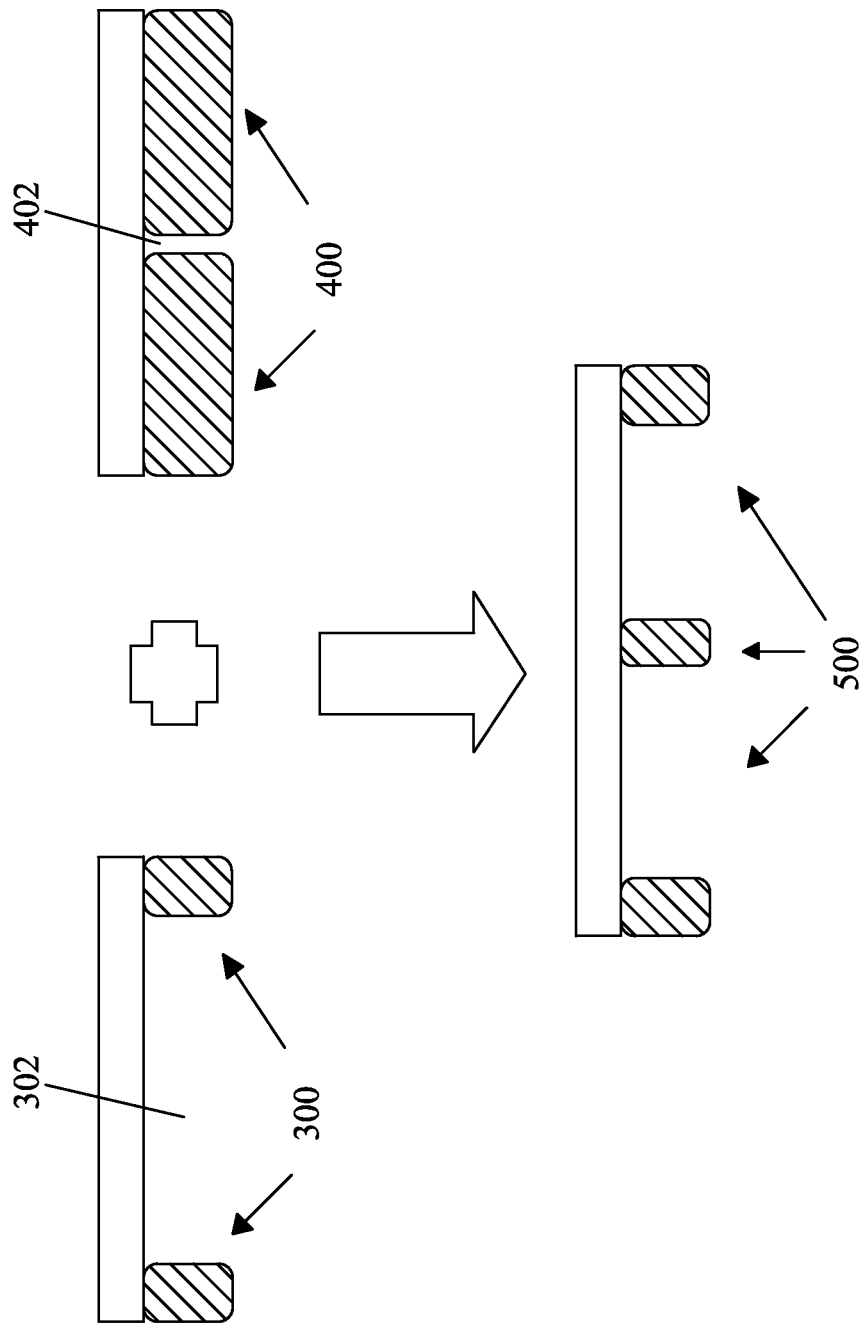
FIG. 3 illustrates a method for forming a pattern on a substrate constructed according to aspects of the present disclosure in an embodiment.

In step 106, a double exposure patterning process is performed. For example, the photosensitive layer 220 is exposed to a first exposure energy through a first mask 300 and then exposed to a second exposure energy through a second mask 400. Referring to FIG. 3, the first mask with a pattern 300 and second mask with a pattern 400 are components of the pattern 500 desired. The area designated by reference numeral 302 is exposed only once. The area designated by reference numerals 402 is exposed twice, during both the first and second exposures.

The nature of the PAGs and PBGs is such that the exposure energy resulting from a single exposure is sufficient to activate the PAGs in the exposed areas to define a trench pattern. In one embodiment, the exposure energy resulting from double exposure is sufficient to activate both the PAGs and the PBGs in the doubly exposed or overlapping areas (with the PAGs in those areas being activated by the first exposure and the PAGs and PBGs being activated by the second exposure). As a result, in the doubly exposed areas, the PAGs and PBGs function to neutralize one another such that, in one embodiment, upon development of the substrate 210, the effective result is as if the doubly exposed areas had not been exposed at all. The doubly exposed areas in one embodiment define a polymer that is insoluble during a developing process, which can be used to define a trench end-to-end pattern or other resist remaining pattern.

The intensities of the first and second exposure energies may be optimized or adjusted to provide sharper contrast and resolution of the final pattern. In one embodiment, the second exposure energy is equal to or exceeds the threshold energy needed to activate the PAG and/or the PBG.

Figure 4:
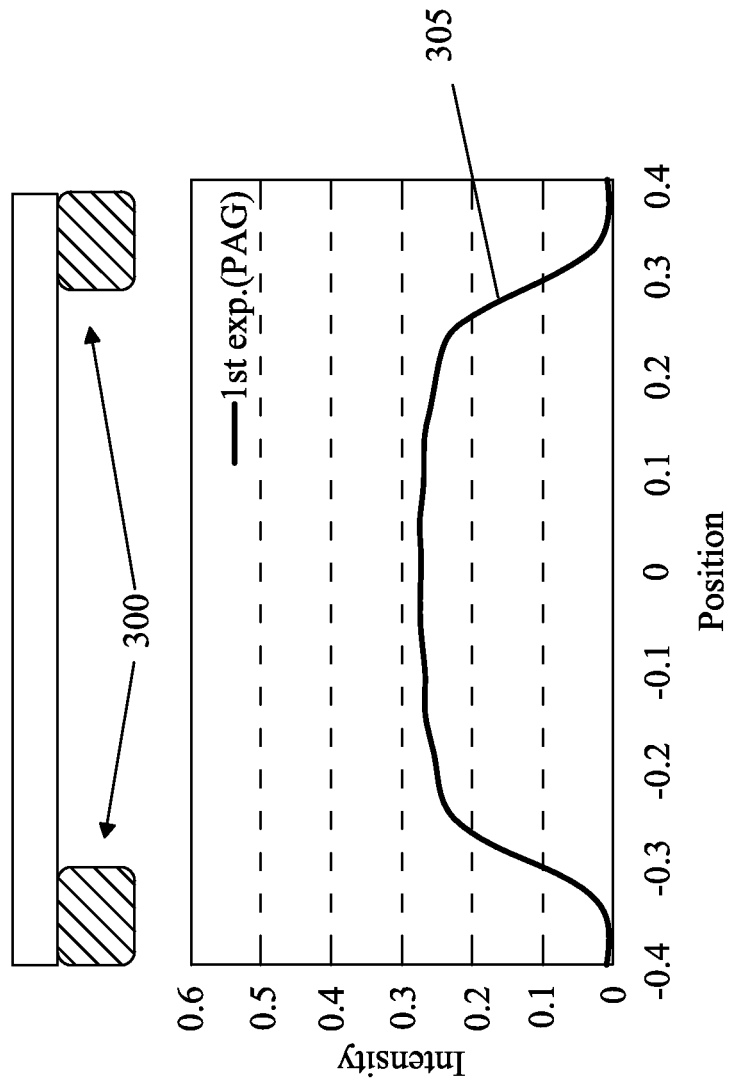
FIG. 4 illustrates the intensity and position for the first exposure in a method for forming a pattern on a substrate constructed according to aspects of the present disclosure in an embodiment.
Figure 5:
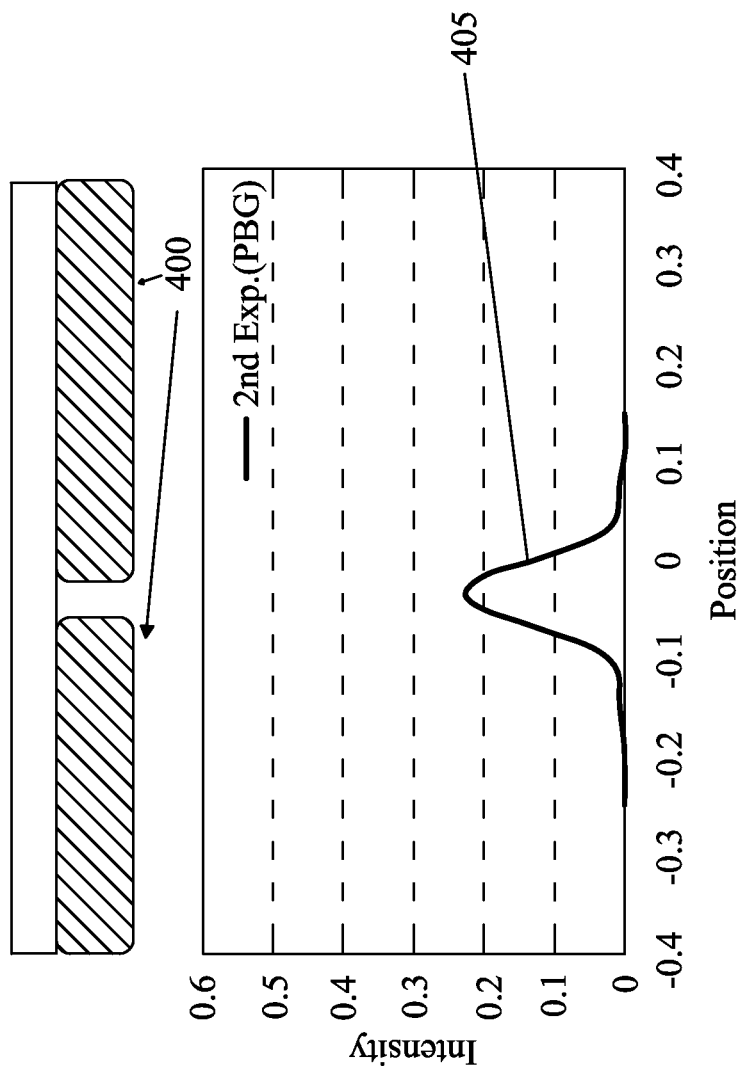
FIG. 5 illustrates the intensity and position for the second exposure in a method for forming a pattern on a substrate constructed according to aspects of the present disclosure in an embodiment.

Referring to FIGS. 4 and 5, for purposes of example, it will be assumed that the substrate 210 will be exposed first using the mask corresponding to the pattern 300 and then exposed for a second time using the mask corresponding to the pattern 400. Using these conditions, FIG. 4 shows the exposure energy along line 305 applied to the first mask with pattern 300 to activate the PAG. Similarly, FIG. 5 shows the exposure energy along line 405 applied to the second mask with pattern 400 to activate the PAG and/or PBG. In the depicted embodiment, the first exposure energy is different than the second exposure energy. The combination of the two patterns 300, 400 is illustrated as a pattern 500.

Figure 6:
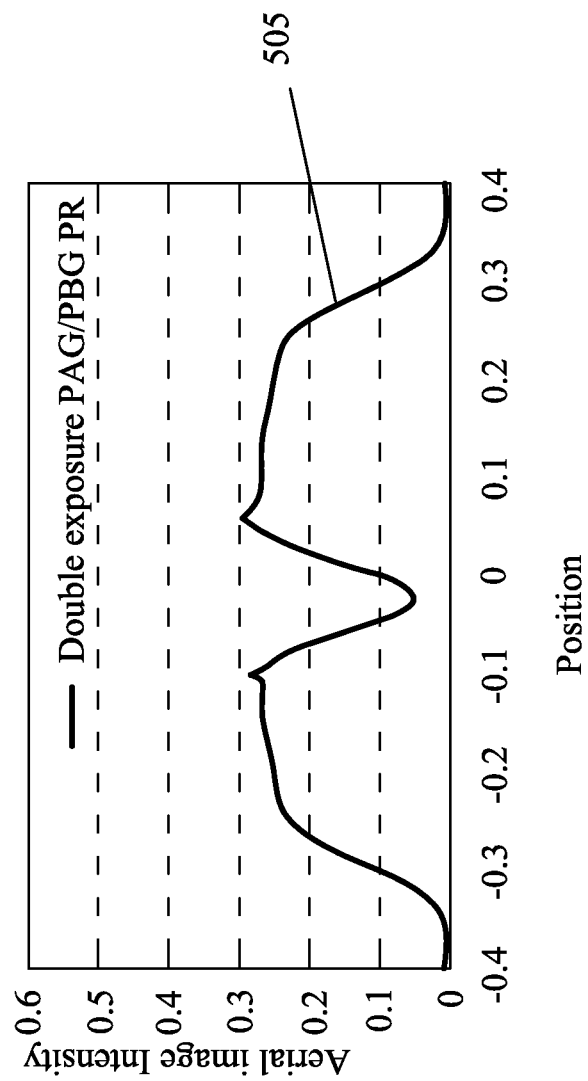
FIG. 6 illustrates the cumulative exposure energy resulting from the first and second exposures in FIGS. 4 and 5.
Figure 7:
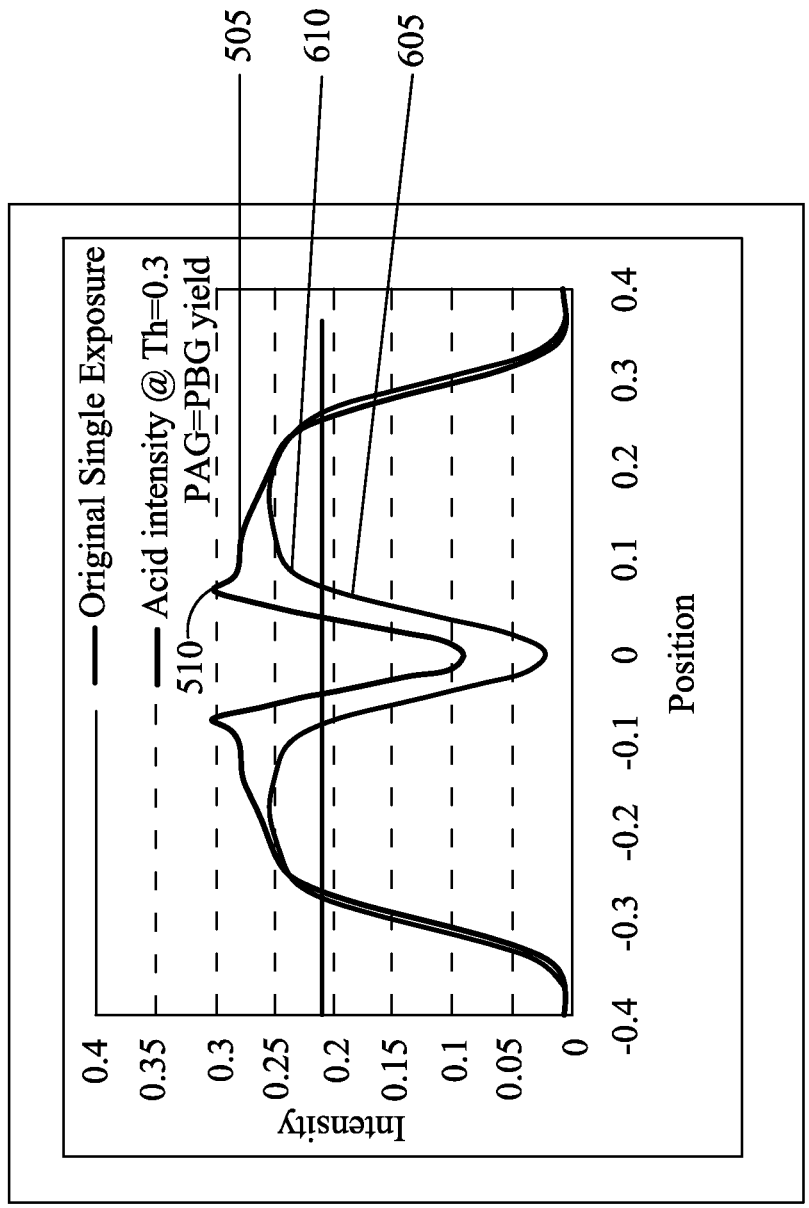
FIG. 7 illustrates the comparison between an original single exposure with the double exposure of FIG. 6.

Referring to FIG. 6, a line 505 represents the cumulative exposure energy resulting from the first and second exposures. FIG. 7 compares the original single exposure 605 with the double exposure 505. As can be seen, the final image contrast for the double exposure 505 is sharper, i.e., has a sharper slope 510, than the slope 610 for the single exposure 605.

Figure 8:
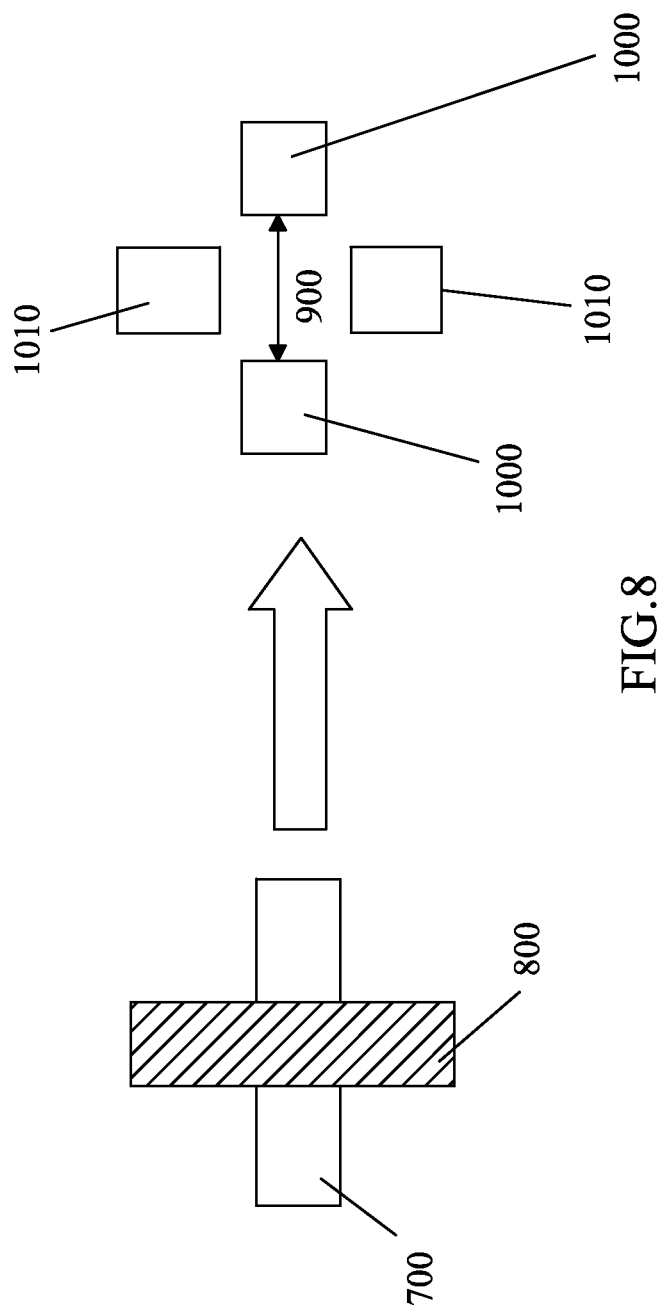
FIG. 8 illustrates a pattern design in a method for forming a pattern on a substrate constructed according to aspects of the present disclosure in an embodiment.

In one embodiment, which is illustrated in FIG. 8, after an exposure process, the base amount generated by the PBG is about equal to the acid generated by the PAG. Area 700 indicates the first exposure area, i.e., areas in the photosensitive layer where the PAG is activated. Area 800 indicates the second exposure area, i.e., areas in the photosensitive layer where PAG and PBG are activated. Area 900 is exposed to both the first and second exposure energies to form a salt and therefore remains after a developing process. Areas 1000 are where acid has formed, and are washed away during a developing process to form a trench. In this case, because PAG and PBG quantum yield is almost the same, and the first exposure dosage equals the second, the area 1010 is an acid area, which can be removed by a developer solution.

Figure 9:
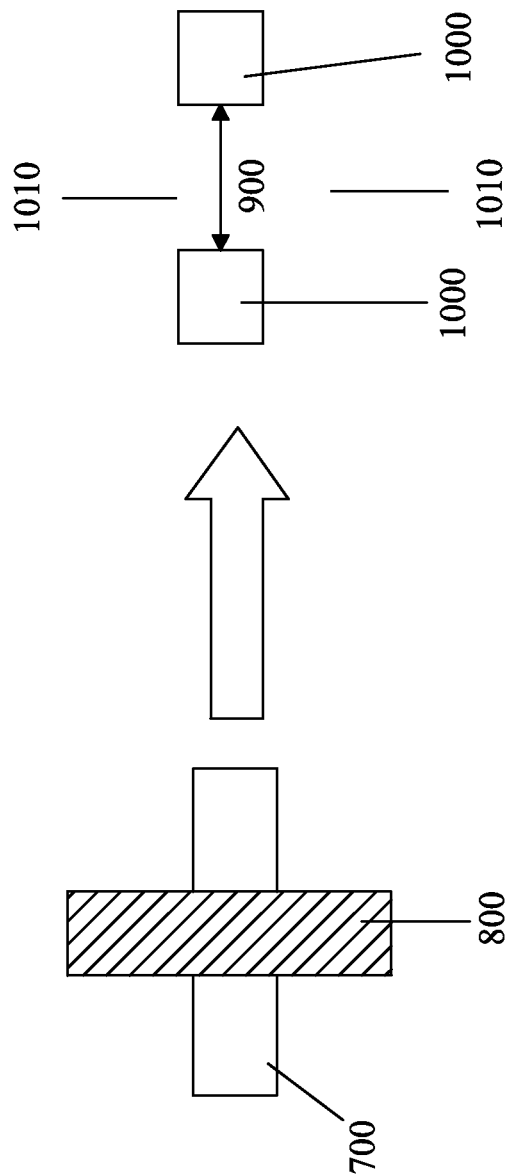
FIG. 9 illustrates a pattern design in a method for forming a pattern on a substrate constructed according to aspects of the present disclosure in an embodiment

In another embodiment, which is illustrated in FIG. 9, the base amount generated by the PBG is substantially greater than the acid generated by the PAG. Area 700 indicates the first exposure area, i.e., areas in the photosensitive layer where the PAG is activated. Area 800 indicates the second exposure area, i.e., areas in the photosensitive layer where PAG and PBG are activated. Area 900 is exposed to both the first and second exposure energies to form a salt and therefore remains after a developing process. Areas 1000 are where acid has formed, and are washed away during a developing process to form a trench. Areas 1010 remain after a developing process because both PAG and PBG are activated, and the amount of base generated by the PBG is more than enough to neutralize the acid generated by the PAG.

The amount of base generated depends on the initial PBG loading (concentration), conversion efficiency, the intensity of the exposure energy, and/or mixing uniformity of the PBG with the other components of the photosensitive layer. The base depletes the acid and enhances the final acid distribution, providing an improved profile and tighter resolution.

It will be recognized that, although the embodiments described herein employ PAGs that are activated by an exposure energy lower than that required to activate the PBGs, the opposite may be true, in which case the exposure energy required to activate the PBGs is less than that required to activate the PAGs.

Subsequently, the photoresist layer may be subjected to a post-exposure bake (PEB) process step 108. The coated photosensitive layer may be baked in a step, referred to as pre baking process, to reduce the solvent.

After a pattern exposure and/or post-exposure bake (PEB) process, the PAG in the photosensitive layer 220 (i.e., photoresist) may produce an acid and thus increase or decrease its solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer, resulting in the polymer becoming more hydrophobic).

Similarly, after a pattern exposure and/or PEB process, the PBG in the photoresist may produce a base that partially neutralizes or totally neutralizes the acid. The base reacts with the acid to make the polymer less soluble to a developing solution.

The method proceeds to step 110, where the photosensitive layer is developed by any suitable process to form a pattern in the photosensitive layer. A developing solution may be utilized to remove portions of the photosensitive layer. An example of a developing solution is tetramethylammonium hydroxide (TMAH). Any concentration level of TMAH developer solution may be utilized, such as approximately 2.38% TMAH developer solution. The developing solution may remove the exposed or unexposed portions depending on the resist type. For example, in the present example, the photosensitive layer 220 comprises a negative-type resist, so the exposed portions are not dissolved by the developing solution and remain over substrate 210. If the photosensitive layer 220 includes a positive-type resist, the exposed portions would be dissolved by the developing solution, leaving the unexposed portions behind. The semiconductor device may then be subjected to a rinsing process, such as a de-ionized (DI) water rinse. The rinsing process may remove residue particles.

The remaining exposed portions (or unexposed portions) define a pattern. The pattern contains one or more openings or trenches, wherein portions of the underlying substrate 210 are exposed. Subsequent processing may include removing the exposed portions of the substrate 210 within the openings. Alternatively, metal deposition, ion implantation, or other processes can be carried out over the substrate 210. The patterned photoresist may then be removed (or stripped) by any suitable process. For example, the patterned photoresist may be removed with a fluid (or stripping solution). The semiconductor device 200 may be subjected to one or more processes, such as additional patterning, etching, deposition, etc. processes, to form additional features of the semiconductor device 200.

The present disclosure provides various methods and photosensitive materials for lithography patterning. It should be understood that a variety of different patterns can be formed using the presently disclosed methods. By tuning the concentration of PAGs and PBGs, selecting the type of PAGs and PBGs, and/or adjusting the intensity of the exposure energies, trench end-to-end contrast may be improved, and trench end-to-end critical dimensions reduced, simultaneously. Such tuning provides better control over the overall acid and base distribution that occurs during an exposure process. The base distribution may be modified to enhance the final acid distribution, which provides improved acid/base distribution contrast, resulting in an improved pattern profile. The modified base distribution particularly improves resolution (contrast) of the resulting pattern. Moreover, the present methods are more cost efficient because they can extend existing lithography tools for use with smaller CDs.

Other variations in this spirit and scope are considered as consistent with the present disclosure and are suggestive. For example, the lithography patterning methods can be used to pattern one material layer disposed on a semiconductor wafer. This material layer can include silicon, silicon oxide, silicon nitride, titanium nitride, silicon oxynitride, metal oxide (e.g. aluminum oxide or hafnium oxide), metal nitride, metal oxynitride, or siloxane. An additional material layer, such as bottom anti-reflective coating (BARC), may be formed on the substrate before forming the photosensitive layer(s). The photosensitive material can be positive tone or alternatively negative tone.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a pattern on a substrate, the method comprising:
   providing a substrate;
   forming a photosensitive layer over the substrate, wherein the photosensitive layer comprises a polymer that turns soluble to a developer solution, at least one photo-acid generator (PAG), and at least one photo-base generator (PBG);
   exposing the photosensitive layer to a first exposure energy through a first mask;
   after exposing to the first exposure energy, exposing the photosensitive layer to a second exposure energy through a second mask, wherein a portion of the layer exposed to the second exposure energy overlaps with a portion exposed to the first exposure energy;
   baking the photosensitive layer; and
   developing the exposed photosensitive layer.

2. The method of claim 1, wherein the first exposure energy is sufficient to activate the PAG and/or the second exposure energy is sufficient to activate the PAG and PBG.

3. The method of claim 1, wherein the PAG is present at a first concentration, and the PBG is present at a second concentration.

4. The method of claim 3, wherein the second concentration is greater than or equal to the first concentration.

5. The method of claim 3, further comprising adjusting the first concentration, second concentration, or both to improve contrast and/or a critical dimension in the pattern.

6. The method of claim 1, wherein the second concentration is greater than the first concentration and the portion of the photosensitive layer exposed to the second exposure energy remains after developing the exposed photosensitive layer.

7. The method of claim 1, wherein the second concentration is about equal to the first concentration and the portion of the photosensitive layer exposed to the second exposure energy is washed away after developing the exposed photosensitive layer.

8. The method of claim 1, wherein the second exposure energy is higher in intensity than the first exposure energy.

9. The method of claim 1, further comprising adjusting an intensity of the first exposure energy, second exposure energy, or both to improve contrast and/or a critical dimension in the pattern.

10. The method of claim 1, wherein the PAG comprises one or more sulfonium salts, iodinium salts, sulfonyldiazomethane compounds, N-sulfonyloxyimide compounds, benzoinsulfonate compounds, pyrogallol trisulfonate compounds, nitrobenzyl sulfonate compounds, sulfone compounds, and glyoxime derivatives.

11. The method of claim 1, wherein the PBG comprises one or more of a carbamate, carbamonylhydroxyamine, oxime, sulfonamide, or lactam.

12. A method for forming a pattern on a substrate, comprising:
    providing a substrate;
    forming a photosensitive layer on a substrate, the photosensitive layer comprising a polymer that turns soluble to a developer solution, a photo-acid generator (PAG) at a first concentration that decomposes to form acid in response to a first exposure energy, and a photo-base generator (PBG) at a second concentration that decomposes to form a base in response to a second exposure energy;
    exposing the photosensitive layer to the first exposure energy through a first mask;
    after exposing to the first exposure energy, exposing the photosensitive layer to the second exposure energy through a second mask, wherein a portion of the layer exposed to the second exposure energy overlaps with a portion exposed to the first exposure energy;
baking the photosensitive layer; and
developing the exposed photosensitive layer.

13. The method of claim 12, wherein the second exposure energy is higher than the first exposure energy to activate the PAG and PBG.

14. The method of claim 12, further comprising adjusting an intensity of the first exposure energy, second exposure energy, or both to improve contrast and/or a critical dimension in the pattern.

15. The method of claim 12, further comprising adjusting the first concentration, second concentration, or both to improve contrast and/or a critical dimension in the pattern.

16. The method of claim 12, wherein the second concentration is greater than the first concentration and the portion of the photosensitive layer exposed to the second exposure energy remains after developing the exposed photosensitive layer.

17. The method of claim 12, wherein the second concentration is about equal to the first concentration and the portion of the photosensitive layer exposed to the second exposure energy is washed away after developing the exposed photosensitive layer.

18. A method for forming a pattern on a substrate, comprising:
providing a substrate;
forming a photosensitive layer on a substrate, the photosensitive layer comprising a polymer that turns soluble to a developer solution, a photo-acid generator (PAG) at a first concentration that decomposes to form acid in response to a first exposure energy, and a photo-base generator (PBG) at a second concentration that decomposes to form a base in response to a second exposure energy;
adjusting the first concentration, second concentration, or both to improve contrast and/or a critical dimension in the pattern;
adjusting an intensity of the first exposure energy, second exposure energy, or both to improve contrast and/or a critical dimension in the pattern;
exposing the photosensitive layer to the first exposure energy through a first mask;
after exposing to the first exposure energy, exposing the photosensitive layer to the second exposure energy through a second mask, wherein a portion of the layer exposed to the second exposure energy overlaps with the a portion exposed to the first exposure energy;
baking the photosensitive layer; and
developing the exposed photosensitive layer.

19. The method of claim 18, wherein the second exposure energy is sufficient to activate the PAG and PBG.

20. The method of claim 18, wherein the second concentration is greater than the first concentration and the portion of the photosensitive layer exposed to the second exposure energy remains after developing the exposed photosensitive layer, or the second concentration is about equal to the first concentration and the portion of the photosensitive layer exposed to the second exposure energy is washed away after developing the exposed photosensitive layer.

* * * * *